United States Patent
Zhang

(10) Patent No.: US 9,281,324 B2
(45) Date of Patent: Mar. 8, 2016

(54) ARRAY SUBSTRATE, FABRICATION METHOD THEREOF AND DISPLAY DEVICE

(71) Applicant: BOE Technology Group Co., Ltd., Beijing (CN)

(72) Inventor: Mi Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/091,313

(22) Filed: Nov. 26, 2013

(65) Prior Publication Data

US 2014/0145200 A1    May 29, 2014

(30) Foreign Application Priority Data

Nov. 27, 2012  (CN) .......................... 2012 1 0492962

(51) Int. Cl.
  *H01L 27/12* (2006.01)
  *H01L 29/786* (2006.01)

(52) U.S. Cl.
  CPC .......... *H01L 27/1259* (2013.01); *H01L 27/124* (2013.01); *H01L 29/78648* (2013.01)

(58) Field of Classification Search
  CPC ............ H01L 27/1214; H01L 27/1259; H01L 29/78648
  USPC ................. 257/59, 72, 258, 909–911, 88–97, 257/202–211, 291–294, 390–391, 257/443–448; 438/34–35, 73–81, 104, 438/381–399, 66–67; 349/55, 59, 39, 98; 313/498–512
  See application file for complete search history.

(56) References Cited

U.S. PATENT DOCUMENTS

| 2003/0141504 | A1  | 7/2003  | Kuwabara et al. |
| 2007/0235803 | A1* | 10/2007 | Shin et al. ................ 257/347 |
| 2007/0273801 | A1* | 11/2007 | Hwang et al. ............. 349/40 |
| 2011/0284852 | A1* | 11/2011 | Kim et al. ................. 257/59 |
| 2012/0061677 | A1* | 3/2012  | Miyake ..................... 257/72 |

FOREIGN PATENT DOCUMENTS

| CN | 101950755 A    | 1/2011  |
| CN | 101989919 A    | 3/2011  |
| WO | WO 2011/135908 A1 | 11/2011 |

OTHER PUBLICATIONS

First Office Action for corresponding Chinese Patent Application No. 201210492962.4, 5 pages, (Sep. 22, 2014).
Second Office Action for corresponding Chinese Patent Application No. 201210492962.4, 3 pages, (Nov. 19, 2014).

* cited by examiner

*Primary Examiner* — Cuong Q Nguyen
*Assistant Examiner* — Tong-Ho Kim
(74) *Attorney, Agent, or Firm* — Blakely, Sokoloff, Taylor & Zafman LLP

(57) ABSTRACT

Embodiments of the present invention provide an array substrate and a fabrication method thereof, and a display device, the array substrate comprises gate lines, data lines, and pixel units defined by the gate lines and the data lines crossing with each other, and each pixel unit comprises a first TFT, whose gate is electrically connected with the gate line, wherein each pixel unit further comprises an auxiliary turn-on structure for forming a turn-on voltage at a channel of the first TFT when the first TFT is switched into conduction. In the embodiments of the present invention, a dual-drive voltage for the first TFT is formed by the auxiliary turn-on structure together with the gate of the first TFT, so that when the turn-on voltage provided by the gate lines is relatively low, the channel of the first TFT can also be turned on, therefore lowering power consumption.

15 Claims, 3 Drawing Sheets

ARRAY SUBSTRATE, FABRICATION METHOD THEREOF AND DISPLAY DEVICE

FIELD OF THE INVENTION

The present invention relates to the field of display technology, and particularly, to an array substrate, a fabrication method thereof, and a display device.

BACKGROUND OF THE INVENTION

An array substrate in the prior art comprises gate lines, data lines, and pixel units defined by the gate lines and the data lines crossing with each other, each pixel unit comprises a thin film transistor (TFT), a pixel electrode and a common electrode, and each pixel unit is only provided with one TFT. A source of the TFT is connected to the data line, a drain of the TFT is connected to the pixel electrode, and a gate of the TFT is driven by the gate line to turn on a TFT channel, so that a voltage signal on the data line is applied to the pixel electrode through the TFT. A relatively high gate turn-on voltage is usually required in turning on the TFT channel, to ensure a charging current and a charging rate at the channel, so that the power consumption is increased.

SUMMARY OF THE INVENTION (I) Technical Problem to be Solved

The technical problem to be solved by embodiments of the present invention is how to reduce power consumption required in turning on a TFT.

(II) Technical Solution

To solve the above technical problem, embodiments of the present invention provide an array substrate, which comprises gate lines, data lines, and pixel units defined by the gate lines and the data lines crossing with each other, and each pixel unit comprises a first TFT, gate of which is electrically connected to the gate line, wherein each pixel unit further comprises:

an auxiliary turn-on structure for forming a turn-on voltage at a channel of the first TFT when the first TFT is switched into conduction.

Preferably, the auxiliary turn-on structure is an auxiliary electrode electrically connected to the gate line, the auxiliary electrode is at least partially located in a region corresponding to the channel of the first TFT, and the auxiliary electrode is insulated from the channel of the first TFT.

Alternatively, the auxiliary turn-on structure is a second TFT, gates of the second TFT and the first TFT are electrically connected with each other, and a drain of the second TFT is used to form the turn-on voltage at the channel of the first TFT.

Herein, an insulating spacer layer is disposed between a source-drain electrode layer of the second TFT and a source-drain electrode layer of the first TFT; a source of the second TFT is connected to an active layer and the gate line; and the drain of the second TFT is connected to the active layer and is at least partially located in a region corresponding to the channel of the first TFT.

Herein, the insulating spacer layer covers the entire array substrate; the source of the second TFT is connected to the active layer and the gate line through a gate line via passing through the insulating spacer layer, the active layer and a gate insulating layer; and the drain of the second TFT is connected to the active layer through a drain via passing through the insulating spacer layer.

Herein, the gate line via is a stepped hole, which has a larger diameter at a portion passing through the insulating spacer layer than a portion passing through the active layer and the gate insulating layer.

Herein, the insulating spacer layer covers a region in which the drain of the second TFT overlaps with the source, the drain and the channel of the first TFT, and the source of the second TFT is connected to the gate line through the gate line via passing through the active layer and the gate insulating layer.

Herein, the array substrate further comprises:

a common electrode line in the same layer as the gate line, wherein an insulating spacer layer is disposed between a source-drain electrode layer of the second TFT and a source-drain electrode layer of the first TFT; the source of the second TFT is connected to an active layer and the common electrode line; and the drain of the second TFT is connected to the active layer and is located in a region corresponding to the channel of the first TFT.

Herein, the insulating spacer layer covers the entire array substrate; the source of the second TFT is connected to the active layer through an active region via passing through the insulating spacer layer, and is connected to the common electrode line through a common electrode line via passing through the insulating spacer layer and a gate insulating layer; and the drain of the second TFT is connected to the active layer through a drain via passing through the insulating spacer layer.

Herein, the insulating spacer layer covers a region in which the drain of the second TFT overlaps with the source, the drain and the channel of the first TFT, and the source of the second TFT is connected to the common electrode line through a common electrode line via passing through the gate insulating layer.

Herein, the auxiliary turn-on structure is further covered with a passivation layer above.

Embodiments of the invention also provide a fabrication method of an array substrate, comprising the following steps:

sequentially forming patterns including a gate line and a gate, a gate insulating layer, and a first active layer and a second active region on a substrate;

forming a pattern including a data line, a first source and a first drain, so as to form a first TFT;

forming an insulating spacer layer;

forming a pattern including a second source and a second drain, so as to form a second TFT, so that gates of the second TFT and the first TFT are electrically connected with each other, and the second drain is located above a channel between the first source and the first drain.

Preferably, the step of forming the insulating spacer layer specifically comprises: forming the insulating spacer layer covering a region in which the second drain overlaps with the first source, the first drain, and the channel between the first source and the first drain; and after forming the insulating spacer layer and before forming the patterns including the second source and the second drain, the method further comprises: forming a gate line via in a region in the gate insulating layer and the second active layer corresponding to the second source to expose the gate line.

Herein, the step of forming the insulating spacer layer specifically comprises: forming the insulating spacer layer covering the entire substrate, at the same time forming a gate line via in a region on the insulating spacer layer corresponding to the second source to expose the gate line, and forming a drain via in a region on the insulating spacer layer corresponding to the second drain to expose the second active layer.

Herein, a common electrode line is also formed while the gate line is formed.

Herein, the step of forming the insulating spacer layer specifically comprises: forming the insulating spacer layer covering a region in which the second drain overlaps with the first source, the first drain, and the channel between the first source and the first drain; and after forming the insulating spacer layer and before forming the patterns including the second source and the second drain, the method further comprises: forming a common electrode line via in a region on the gate insulating layer corresponding to the second source to expose the common electrode line.

Herein, the step of forming the insulating spacer layer specifically comprises:

forming the insulating spacer layer covering the entire substrate, at the same time forming a common electrode line via in a region on the insulating spacer layer corresponding to the second source to expose the common electrode line, forming a drain via in a region on the insulating spacer layer corresponding to the second drain to expose the second active layer, and forming an active region via in a region on the insulating spacer layer corresponding to the second source to expose the second active layer.

Embodiments of the invention also provide a fabrication method of an array substrate, comprising the following steps:

Forming a pattern including a second source and a second drain on a substrate:

forming an insulating spacer layer;

forming a pattern including a data line, a first source and a first drain;

and sequentially forming patterns including a first active layer and a second active region, a gate insulating layer, and a gate line and a gate, so as to form a first TFT and a second TFT, so that gates of the second TFT and the first TFT are electrically connected with each other, and the second drain is located below a channel between the first source and the first drain.

Embodiments of the present invention also provide a display device, comprising any one of the array substrates described above.

(III) Beneficial Effects

In an array substrate of the embodiments of the present invention, a turn-on voltage is supplied to the channel of the first TFT through the auxiliary turn-on structure (such as the second TFT), that is, a dual-drive voltage for the first TFT is formed by the auxiliary turn-on structure together with the gate of the first TFT, so that even when the turn-on voltage provided by the gate lines is relatively low, the channel of the first TFT can be opened, thereby lowering the power consumption.

DETAILED DESCRIPTION OF THE EMBODIMENTS

An array substrate of the present invention comprises gate lines, data lines, and pixel units defined by the gate lines and the data lines crossing with each other. Each pixel unit comprises a first TFT and a pixel electrode. The first TFT has a gate connected to the gate line, a source connected to the data line, and a drain connected to the pixel electrode. The gate line drives the gate to turn on a channel of the first TFT, so that a voltage signal on the data line is applied to the pixel electrode through the first TFT to display a frame. However, a relatively high gate turn-on voltage is usually required when turning on the channel of the first TFT, to ensure a charging current and a charging rate at the channel, so that the power consumption is increased. To solve this problem, the array substrate of the embodiment of the present invention farther comprises an auxiliary turn-on structure (e.g., second TFT) which can form a turn-on voltage at the channel of the first TFT when the gate line drives the gate of the first TFT, and the turn-on voltage turns on the channel of the first TFT together with a turn-on voltage provided by the gate of the first TFT. Due to the auxiliary turn-on structure, the channel of the first TFT can also be turned on in the case that the turn-on voltage provided by the gate line is relatively low, thus reducing the power consumption.

Specific implementations of the present invention will be described below in further details in conjunction with the accompanying drawings and the embodiments. The following embodiments are used for illustrating the present invention rather than limiting the scope of the present invention.

Embodiment 1

Figure 1:
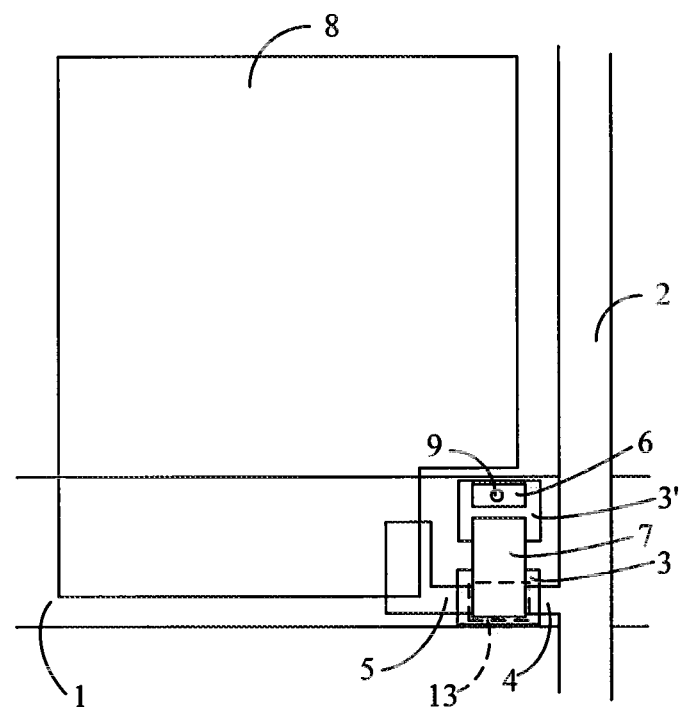
FIG. 1 is a schematic diagram of a plane structure of an array substrate of Embodiment 1 of the present invention.
Figure 2:
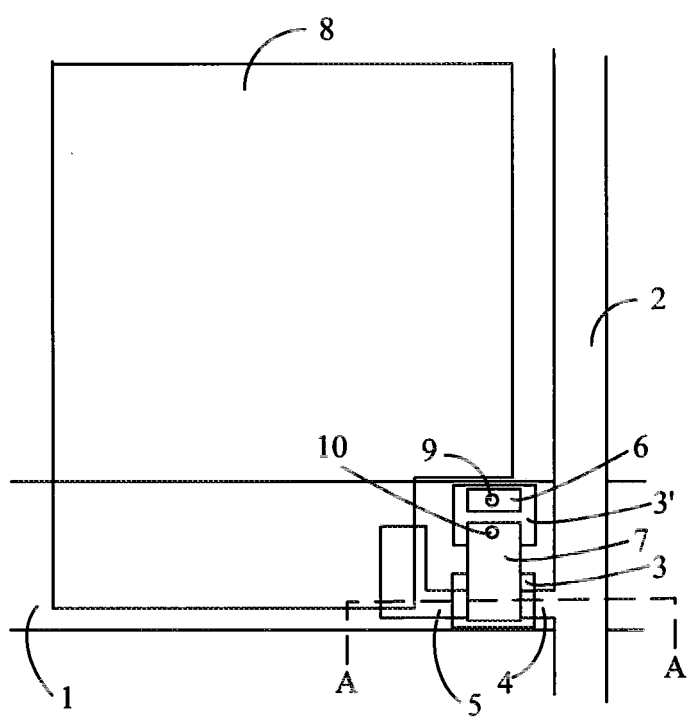
FIG. 2 is a schematic diagram of a plane structure of another array substrate of Embodiment 1 of the present invention.
Figure 3:
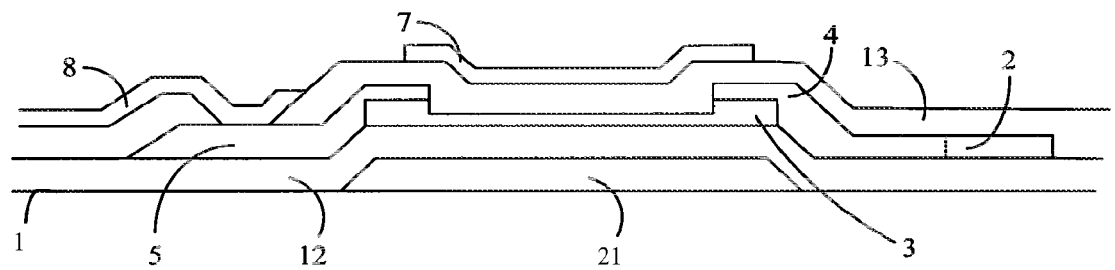
FIG. 3 is a sectional diagram along A-A in FIG. 2.

As shown in FIGS. 1, 2 and 3, the structure of an array substrate of this embodiment comprises gate lines 1, data lines 2, and pixel units defined by the gate lines 1 and the data lines 2 crossing with each other. Each pixel unit comprises a first TFT and a pixel electrode 8. The first TFT has a gate (not shown in the figures) electrically connected to the gate line 1 (in this embodiment, the gate of the first TFT is integral with the gate line 1, and the gate is the gate line 1. However, the gate may also be a protrusion 21 located at one side of the gate line 1 and formed integrally with the gate line 1), a source 4 connected to the data line 2, and a drain 5 connected to the pixel electrode 8. As shown in FIG. 3, a gate insulating layer 12 and an active layer 3 are sequentially disposed on the gate. The source 4 and the drain 5 are disposed on the active layer 3, and a channel is formed in a portion of the active layer 3 between the source 4 and the drain 5 (the first TFT of this embodiment has a bottom-gate structure, while in the case of a top-gate structure, the gate insulating layer 12 and the active layer 3 are sequentially disposed under the gate, and the source 4 and the drain 5 are disposed under the active layer 3).

In the embodiment, a second TFT is further included. A drain 7 of the second TFT is located above the channel of the first TFT (the first TFT of this embodiment has a bottom-gate structure, while in the case of a top-gate structure, the drain 7 of the second TFT is located under the channel of the first TFT) and is connected to an active layer 3'; a source 6 is connected to both the gate line 1 and the active layer 3' (the active layer 3' of the second TFT and the active layer 3 of the first TFT may be located in the same layer but separated from each other), and the gate of the second TFT is electrically connected to the gate of the first TFT (in this embodiment, the gate of the second TFT is also integral with the gate line 1, and therefore is certainly electrically connected with the gate of the first TFT. However, the gate of the second TFT may also be a protrusion located at one side of the gate line 1 and formed integrally with the gate line 1). To avoid contact between the sources and drains of the two TFTs, an insulating spacer layer 13 is disposed on the source 4, the drain 5 and the channel of the first TFT, and the source 6 and the drain 7 of the second TFT are disposed on the insulating spacer layer 13.

Herein, the insulating spacer layer 13 may only cover a region on the source 4, the drain 5 and the channel of the first TFT, that is the region covered by the insulating spacer layer 13 is a region in which the drain 7 of the second TFT overlaps with the source 4, the drain 5 and the channel of the first TFT, as shown by the dashed box in FIG. 1, thus preventing the drain 7 of the second TFT from contacting with the drain 5 and the source 4 of the first TFT. In addition, the source 6 and the drain 7 of the second TFT are in direct contact with the active layer 3', and the source 6 is also connected to the gate line 1 through a gate line via 9 passing through the active layer 3' and the gate insulating layer 12.

For convenience of fabrication, the insulating spacer layer 13 may also cover the entire substrate, rather than the small region of the dashed box in FIG. 1. As shown in FIG. 2, in this case, the source 6 of the second TFT is connected to the active layer 3' and the gate line 1 through the gate line via 9 passing through the insulating spacer layer 13, the active layer 3' and the gate insulating layer 12, that is to say, the side wall of the source 6 in the gate line via 9 is in contact with the active layer 3', and the bottom surface thereof is in contact with the gate line 1, thereby connecting the active layer 3' to the gate line 1. The drain 7 is connected to the active layer 3' through a drain via 10 passing through the insulating spacer layer 13.

As described above, at this point, the source 6 comes into contact with the source layer 3' only through side wall of a part thereof in the gate line via 9, and the contact area is small. For this reason, further, the gate line via 9 passing through the insulating spacer layer 13, the active layer 3' and the gate insulating layer 12 is preferably a stepped hole, and the gate line via 9 has a larger diameter at a portion passing through the insulating spacer layer 13 than at portions passing through the active layer 3' and the gate insulating layer 12, so that the bottom surface of the source 6 in the large hole (the hole in the insulating spacer layer 13) portion can also be in contact with the active layer 3', so as to achieve better contact between the source 6 and the active layer 3'.

When a gate scanning signal is input to the gate line 1, a turn-on voltage is supplied to the channel of the first TFT, and at the same time a turn-on voltage is also supplied to the channel of the second TFT. When the second TFT is turned on, the drain 7 thereof has the same voltage as the gate line 1 (because the source 6 thereof is connected to the gate line 1), and as the drain 7 thereof is located on the channel of the first TFT, it is equivalent to that the gate line 1 and the drain 7 supply the turn-on voltage to the channel of the first TFT at the same time, that is, a dual-drive voltage for the channel of the first TFT is formed by the drain 7 together with the gate line 1, so that electric charges at the channel of the first TFT are increased. Therefore, a drive voltage of the gate line 1 may be lowered appropriately, and the first TFT can also be turned on, so that the power consumption is reduced.

The fabrication method of the above array substrate is as follows:

step 1: sequentially forming patterns including a gate line 1 and a gate, a gate insulating layer 12, and a first active layer 3 and a second active region 3' on a substrate. The step is specifically as follows:

preparing a layer of gate metal film with a thickness of 1000 Å-7000 Å on the glass substrate by using a magnetron sputtering process, wherein the gate metal film may generally adopt a metal material, such as molybdenum, aluminum, aluminum nickel alloy, molybdenum tungsten alloy, chromium, copper or the like, or may also use a composite structure of films formed by several of the above materials; forming a pattern of the gate lines 1 and the gate in a certain region on the glass substrate through an exposing process and a chemical etching process by using a gate mask;

then, continuously depositing a gate insulating layer film with a thickness of 1000 Å-6000 Å and an amorphous silicon film with a thickness of 1000 Å-6000 Å on the array substrate by using a chemical vapor deposition process, wherein a material of the gate insulating layer 12 is usually silicon nitride, and may also be silicon oxide, silicon oxynitride or the like; and performing dry etching on the amorphous silicon after exposing using a mask of a active layer, so as to form two independent silicon islands, namely, the first active layer 3 and the second active region 3', wherein the insulating layer between the gate metal and the amorphous silicon has an etching blocking function.

step 2: forming a pattern including a data line 2, a source 4 (first source) and a drain 5 (first drain), so as to form a first TFT. The step is specifically as follows:

depositing a layer of metal film similar to the gate metal with a thickness of 1000 Å-7000 Å on the substrate subjected to step 1, by adopting a method similar to that for preparing the gate lines; forming the data line 2 the first source 4 and the first drain 5 in a certain region through a mask of the source and the drain to form the first TFT, wherein the data line 2, the first source 4 and the first drain 5 have the same thickness and post-corrosion slope angle.

step 3: foaming an insulating spacer layer 13: depositing an insulating film with a thickness of 1000 Å-6000 Å on the entire array substrate by adopting a method similar to that for forming the gate insulating layer 12 and the active layers 3, 3', wherein the material of the insulating film is generally silicon nitride or silicon dioxide. At this point, the gate line 1 is covered with films of the gate insulating layer 12 and the insulating spacer layer 13, whereas the data line 2, the first source 4 and the first drain 5 are covered with an insulating film with the same thickness.

To prevent a drain 7 (second drain) of a second TFT formed subsequently from contacting with the source 4 and the drain 5 of the first TFT, exposing and etching processes are performed on the insulating film by using a mask, so that the insulating film covers a region in which the second drain 7 overlaps with the first source 4, the first drain 5, and the channel between the first source 4 and the first drain 5, as shown by the dashed box in FIG. 1, thereby forming the insulating spacer layer 13. In addition, a gate line via 9 is formed in a region on the gate insulating layer 12 and the active layer 3' corresponding to a source 6 (second source) of the second TFT formed subsequently to expose the gate line 1, so that the second source 6 formed subsequently can contact the gate line 1.

Or, as an alternative way of this embodiment, to save technical process, the deposited insulating film covering the entire substrate may also be used as the insulating spacer layer 13. As shown in FIG. 2, at this point, after forming the insulating spacer layer 13, the gate line via 9 is formed in a region on the insulating spacer layer 13 corresponding to the source 6 of the second TFT to expose the gate line 1, and a drain via 10 is formed in a region corresponding to the drain 7 to expose the second active layer 3' through performing exposing and etching processes using a mask.

Herein, the gate line via 9 is required to pass through the insulating spacer layer 13, the second active layer 3' and the gate insulating layer 12. Preferably, the gate line via 9 is made into a stepped hole, and has a larger diameter at the portion passing through the insulating spacer layer 13 than the portion passing through the second active layer 3' and the gate insulating layer 12, so that the second source 6 can be in better contact with the active layer 3'. During fabrication, the above structure may be achieved merely by performing exposing, developing, etching, ashing and etching processes on the region where the stepped hole is required to be made by using a half tone or a gray tone mask.

step 4: forming a pattern including the second source 6 and the second drain 7 on the substrate subjected to step 3, so as to form the second TFT, so that the gates of the second TFT and the first TFT are electrically connected with each other, and the second drain 7 is located above the channel between the first source 4 and the first drain 5. The specific method is as follows: depositing an electrode layer on the substrate, and finally forming a pattern of the second source 6 and the second drain 7 through exposing, etching and other processes by using a mask, so as to form the second TFT. After the completion of this step, the second source 6 may be in contact with the gate line 1 through the gate line via 9 formed in step 3, and the second source 6 and the second drain 7 may be in direct contact with the second active layer 3', as shown in FIG. 1. Or the second source 6 may be connected to the gate line 1 and the second active layer 3', respectively, through the gate line via 9 formed in step 3, and the second drain 7 may be in connected with the second active layer 3' through the drain via 10 formed in step 3, as shown in FIG. 2.

A pixel electrode 8 may also be formed at the same time in this step (the pixel electrode 8 and its connection with the drain 5 of the first TFT can be fabricated through existing fabrication processes, that is, forming a via in a region where the pixel electrode 8 is in contact with the drain 5 after forming the insulating spacer layer 13), that is, the second source 6, the second drain 7 and the pixel electrode 8 are formed through a mask at the same time after depositing a transparent electrode. The transparent electrode generally adopts a material of indium tin oxide (ITO) or indium zinc oxide (IZO), and has a thickness of 100 Å-1000 Å.

A step of fabricating a passivation layer on the entire substrate is preferably included after step 4, so as to protect the array substrate.

Embodiment 2

Figure 4:
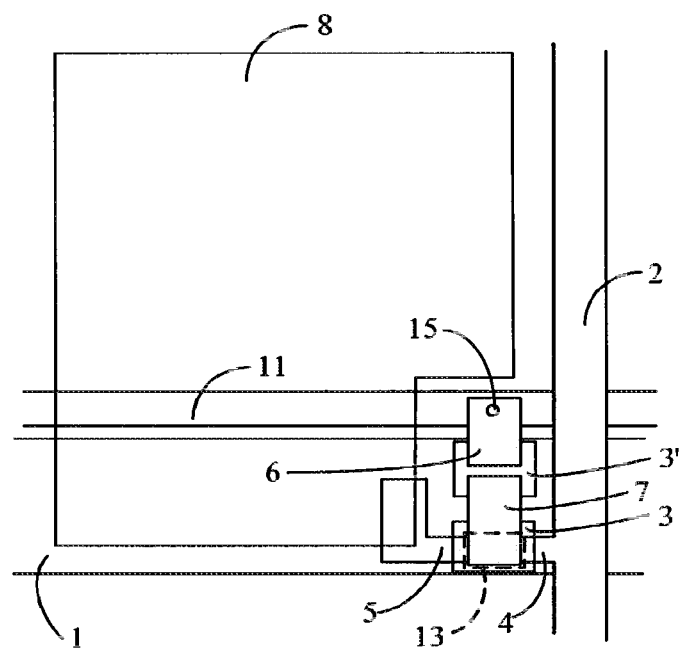
FIG. 4 is a schematic diagram of a plane structure of an array substrate of Embodiment 2 of the present invention.
Figure 5:
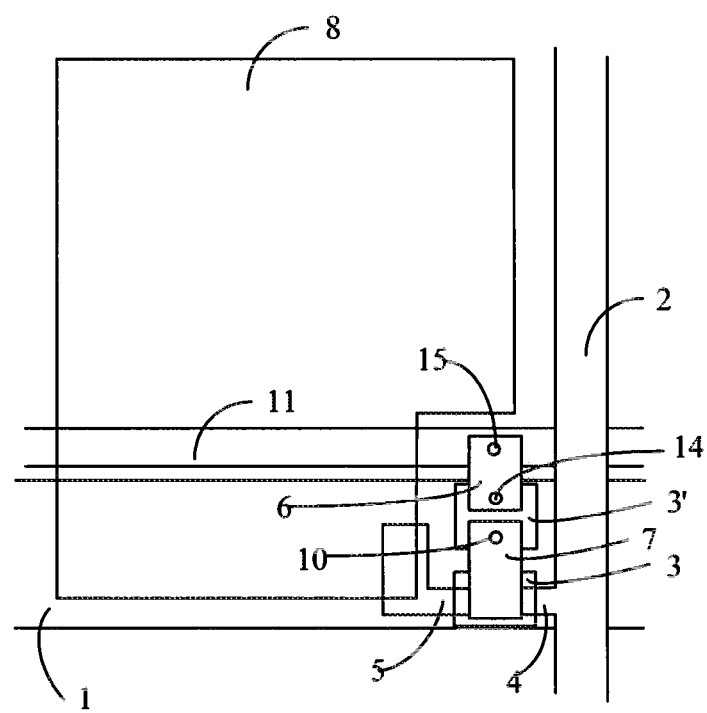
FIG. 5 is a schematic diagram of a plane structure of another array substrate of Embodiment 2 of the present invention.

As shown in FIGS. 3, 4 and 5, the structure of an array substrate of this embodiment, comprises gate lines 1, data lines 2, and pixel units defined by the gate lines 1 and the data lines 2 crossing with each other. Each pixel unit comprises a first TFT, a pixel electrode 8 and a common electrode line 11, and the common electrode line 11 is usually located in the same layer as the gate line 1. The first TFT has a gate 1 (not shown in the figure) connected to the gate line (in the embodiment, the gate of the first TFT is integral with the gate line 1 and the gate is the gate line 1. However, the gate may also be a protrusion located at one side of the gate line 1 and formed integrally with the gate line 1), a source 4 connected to the data line 2, and a drain 5 connected to the pixel electrode 8. As shown in FIG. 3, a gate insulating layer 12 and an active layer 3 are sequentially disposed on the gate. The source 4 and the drain 5 are disposed on the active layer 3, and a channel is formed in a region of the active layer 3 between the source 4 and the drain 5 (the first TFT of this embodiment has a bottom-gate structure, while in the case of a top-gate structure, the gate insulating layer 12 and the active layer 3 are sequentially disposed under the gate, and the source 4, the drain 5 and the channel formed between the source 4 and the drain 5 are disposed under the active layer 3).

In this embodiment, a second TFT is also included. A drain 7 of the second TFT is located above the channel of the first TFT (the first TFT of the embodiment has a bottom-gate structure, while in the case of a top-gate structure, the drain 7 of the second TFT is located below the channel of the first TFT) and is connected to an active layer 3', a source 6 is connected to the common electrode line 11 and the active layer 3', and the gates of the second TFT and the first TFT are electrically connected with each other (in the embodiment, the gate of the second TFT is also integral with the gate line 1, and therefore is certainly electrically connected to the gate of the first TFT. However, the gate of the second TFT may also be a protrusion located at one side of the gate line 1 and formed integrally with the gate line 1). To avoid the contact between the sources and drains of the two TFTs, an insulating spacer layer 13 is disposed on the source 4, the drain 5 and the channel of the first TFT, and the source 6 and the drain 7 of the second TFT are disposed on the insulating spacer layer 13.

Herein, the insulating spacer layer 13 may only cover a region on the drain 5, the source 4 and the channel of the first TFT, as shown by the dashed box in FIG. 4, thus preventing the drain 7 of the second TFT from contacting with the drain 5 and the source 4 of the first TFT. In addition, the source 6 and the drain 7 of the second TFT are in direct contact with the active layer 3'. The source 6 is connected to the common electrode line 11 through a common electrode line via 15 passing through the gate insulating layer 12.

For convenience of fabrication, the insulating spacer layer 13 may also cover the entire substrate, rather than the small region of the dashed box in FIG. 4. As shown in FIG. 5, in this case, the source 6 of the second TFT is connected to the common electrode line 11 through the common electrode line via 15 passing through the gate insulating layer 12 and the insulating spacer layer 13, and is connected to the active layer 3' through an active region via 14 passing through the insulating spacer layer 13; and the drain 7 of the second TFT is connected to the active layer 3' through a drain via 10 passing through the insulating spacer layer 13.

When a gate scanning signal is input to the gate line 1, a turn-on voltage is supplied to the channel of the first TFT; and at the same time a common electrode line signal is also input to the common electrode line 11 to supply a turn-on voltage to the channel of the second TFT. When the second TFT is turned on, its drain 7 has the same voltage as the common electrode line 11 (because its source 6 is connected to the common electrode line 11), and as its drain 7 is located on the channel of the first TFT, it is equivalent to that the gate line 1 and the common electrode line 11 supply the turn-on voltage to the channel of the first TFT at the same time, that is a dual-drive voltage for the channel of the first TFT is formed by the gate line 1 together with the common electrode line 11, so that electric charges at the channel of the first TFT are increased. Therefore, a drive voltage of the gate line 1 may be lowered appropriately, and the first TFT can also be turned on, so that the power consumption is reduced.

The fabrication method of the above array substrate is as follows:

step 1: sequentially forming patterns including a gate line 1 and a gate and a common electrode line 11, a gate insulating layer 12, and a first active layer 3 and a second active layer 3' on a substrate. The step is specifically as follows:

preparing a layer of gate metal film with a thickness of 1000 Å-7000 Å on the glass substrate by using a magnetron sputtering process, wherein the gate metal film may generally adopt a metal material, such as molybdenum, aluminum, aluminum nickel alloy, molybdenum tungsten alloy, chromium, copper or the like, or may also use a composite structure of films formed by several of the above materials; forming a pattern of the gate line 1, the common electrode line 11 and the gate in a certain region on the glass substrate through an exposing process and a chemical etching process by using a gate mask;

then, continuously depositing a gate insulating layer film with a thickness of 1000 Å-6000 Å and an amorphous silicon film with a thickness of 1000 Å-6000 Å on the array substrate by using a chemical vapor deposition process, wherein a material of the gate insulating layer 12 is usually silicon nitride, and may also be silicon oxide, silicon oxynitride or the like;

Performing dry etching on the amorphous silicon after performing exposure by using a mask of the active layer, so as to form a pattern with two independent silicon islands, namely, the first active layer 3 and the second active region 3', wherein the insulating layer between the gate metal and the amorphous silicon has an etching blocking function.

step 2: forming a pattern including a data line 2, a source 4 (first source) and a drain 5 (first drain), so as to form a first TFT. This step is specifically as follows: depositing a layer of metal film similar to the gate metal with a thickness of 1000 Å-7000 Å on the substrate subjected to step 1, by adopting a method similar to that for preparing the gate lines; forming the data line 2, the first source 4 and the first drain 5 in a certain region through a mask of the source and the drain, so as to form the first TFT, and also forming a light blocking strip (not shown in the figures). Herein the data line 2, the first source 4, the first drain 5 and the light blocking strip have the same thickness and post-corrosion slope angle.

step 3: forming an insulating spacer layer 13. An insulating film with a thickness of 1000 Å-6000 Å is deposited on the entire array substrate by adopting a method similar to that for forming the gate insulating layer 12 and the active layers 3, and 3', and the material of the insulating film is generally silicon nitride or silicon dioxide. At this point, the gate line 1 and the common electrode line 11 are covered with films of the gate insulating layer 12 and the insulating spacer layer 13, whereas the data line 2, the first source 4, the first drain 5 and the light blocking strip are covered with the insulating film with the same thickness.

To prevent a drain 7 (second drain) of a second TFT formed subsequently from contacting with the source 4 and the drain 5 of the first TFT, exposure etching processes are performed on the insulating film by using a mask, so that the insulating film covers, a region in which the second drain 7 overlaps with the first source 4, the first drain 5, the channel between the first source 4 and the first drain 5, as shown by the dashed box in FIG. 4, thereby forming the insulating spacer layer 13. After forming the insulating spacer layer 13, the common electrode line 11 is only covered with the gate insulating layer 12, and a common electrode line via 15 is formed in a region on the gate insulating layer 12 corresponding to a source 6 (second source) formed subsequently by performing exposing and etching processes through a mask, so as to expose the common electrode line 11, so that the second source 6 formed subsequently can come into contact with the common electrode line 11.

Or, as an alternative way of the embodiment, to save technical process, the deposited insulating film covering the entire substrate may also be used as the insulating spacer layer 13. As shown in FIG. 5, in this case, after forming the insulating spacer layer 13, the common electrode line via 15 is formed in a region on the insulating spacer layer 13 corresponding to the second source 6 formed subsequently to expose the common electrode line 11, a drain via 10 is formed in a region on the insulating spacer layer 13 corresponding to the second drain 7 formed subsequently to expose the active layer 3', and an active region via 14 is formed in a region on the insulating spacer layer 13 corresponding to the second source 6 to expose the active layer 3', by performing exposing and etching processes through a mask.

step 4: forming a pattern including the second source 6 and the second drain 7 on the substrate subjected to step 3, so as to form the second TFT, so that the gates of the second TFT and the first TFT are electrically connected with each other, and the second drain 7 is located above the channel between the first source 4 and the first drain 5. The specific method is as follows: depositing an electrode layer on the substrate, and finally forming a pattern of the second source 6 and the second drain 7 through exposing, etching and other processes using a mask, so as to form the second TFT. After the completion of this step, the second source 6 and the second drain 7 may be in direct contact with the active layer 3', and the second source 6 may be connected to the common electrode line 11 through the common electrode line via 15 formed in step 3, as shown in FIG. 4. Or, the second source 6 may be connected to the common electrode line 11 and the second active layer 3' through the common electrode line via 15 and the active region via 14 formed in step 3, respectively, and the second drain 7 may be connected to the second active layer 3' through the drain via 10 formed in step 3, as shown in FIG. 5.

In this step, a pixel electrode 8 may be formed at the same time (the pixel electrode 8 and its connection with the drain 5 of the first IT can be fabricated through existing fabrication processes, for example, a via is formed in the region where the pixel electrode 8 is in contact with the drain 5 after forming the insulating spacer layer 13), that is, the second source 6, the second drain 7 and the pixel electrode 8 are fabricated through a mask at the same time after depositing a transparent electrode. The transparent electrode generally adopts a material of indium tin oxide (ITO) or indium zinc oxide (IZO), and has a thickness of 100 Å-1000 Å.

A step of fabricating a passivation layer on the entire substrate is preferably included after step 4, so as to protect the array substrate.

Bottom-gate TFTs are prepared in the above two embodiments, while for a top-gate TFT whose sequence of layers is just reverse to that of a bottom-gate TFT, its fabrication method mainly includes the following steps:

forming a pattern including a second source and a second drain on a substrate;

forming an insulating spacer layer;

forming a pattern including a data line, a first source and a first drain;

sequentially forming patterns including a first active layer and a second active layer, a gate insulating layer, and a gate line and a gate, so as to form a first TFT and a second TFT, so that the gates of the second TFT and the first TFT are electrically connected with each other, and the second drain is located below the channel between the first source and the first drain.

Specific steps of each step of this method are similar to those for fabricating a bottom-gate TFT, and are not elaborated herein.

The embodiments described above may also have other different implementing ways, for example, the present invention can also be realized by increasing or reducing times of masking, changing specific patterns or use sequence of the masks, or selecting different materials or material combinations. Specifically, in the above embodiments, it is taken as an example that the source-drain layer of the first TFT and the source-drain layer of the second TFT are located in different layers. However, it should be understood that the source-drain layer of the first TFT and the source-drain layer of the second TFT can be located in the same layer (or, may be formed at the same time), then a metal layer is formed on the channel of the first TFT, and the metal layer is connected to the drain of the second TFT through a via, which can also realize the present invention. In summary, regardless of arrangements of the respective structures of the two TFTs, it is within the protection scope of the present invention, as long as the gates of the two TTFs are electrically connected with each other, and the second TFT can form a turn-on voltage at the channel of the first TFT.

Embodiment 3

An array substrate of this embodiment comprises gate lines, data lines, and pixel units defined by the gate lines and the data lines crossing with each other, and each pixel unit comprises:
a first TFT, whose gate is electrically connected to the gate line; and
an auxiliary electrode, which is at least partially located in a region corresponding to a channel of the first TFT (for a bottom-gate TFT, it is above the channel, while for a tog-gate TFT, it is below the channel), and is insulated from the channel of the first TFT (e.g., being separated by an insulating layer), so as to form a turn-on voltage at the channel of the first TFT when the first TFT is switched into conduction (i.e., when the gate line supplies a break-over signal).

That is to say, in an array substrate of the embodiment of the present invention, the auxiliary turn-on structure may not include a TFT, instead, an auxiliary electrode is directly used to guild a signal of the gate line to the channel region of the first TFT, so as to form an auxiliary turn-on voltage.

Embodiment 4

A display device of this embodiment comprises an array substrate in any of the above embodiments. The display device can be any product or component with a display function, such as a liquid crystal panel, an electronic paper, an OLED panel, a liquid crystal television, a liquid crystal display, a digital photo frame, a mobile phone, a tablet computer or the like.

By adopting the above array substrate, the power consumption of the display device is reduced.

The above implementing ways are only used to illustrate the present invention, but not to limit the present invention. Various alterations and variations can be made by the person skills in the art without departing from the spirit and scope of the present invention, and therefore all equivalent technical solutions are also within the scope of the present invention, and the protection scope of the present invention should be defined by the claims.

What is claimed is:

1. An array substrate, comprising: gate lines, data lines, and pixel units defined by the gate lines and the data lines crossing with each other, and each pixel unit comprises a first thin film transistor, a gate of which is electrically connected to a gate line of the gate lines, wherein each pixel unit further comprises:
an auxiliary turn-on structure for forming a turn-on voltage at a channel of the first thin film transistor when the first thin film transistor is switched into conduction,
wherein the auxiliary turn-on structure is a second thin film transistor, a gate of the second thin film transistor and the gate of the first thin film transistor are electrically connected with each other, and a drain of the second thin film transistor is used to form the turn-on voltage at the channel of the first thin film transistor,
wherein an insulating spacer layer is provided between a source-drain electrode layer of the second thin film transistor and a source-drain electrode layer of the first thin film transistor; a source of the second thin film transistor is connected to an active layer of the second thin film transistor and the gate line; and the drain of the second thin film transistor is connected to the active layer of the second film transistor and is at least partially located in a region corresponding to the channel of the first thin film transistor.

2. The array substrate according to claim 1, wherein the insulating spacer layer covers the entire array substrate; the source of the second thin film transistor is connected to the active layer and the gate line through a gate line via passing through the insulating spacer layer, the active layer and a gate insulating layer; and the drain of the second thin film transistor is connected to the active layer through a drain via passing through the insulating spacer layer.

3. The array substrate according to claim 2, wherein the gate line via is a stepped hole, which has a hole diameter at a portion passing through the insulating spacer layer larger than a hole diameter at a portion passing through the active layer and the gate insulating layer.

4. The array substrate according to claim 1, wherein the insulating spacer layer covers a region in which the drain of the second thin film transistor overlaps with a source, a drain and the channel of the first thin film transistor, and the source of the second thin film transistor is connected to the gate line through the gate line via passing through the active layer and a gate insulating layer.

5. An array substrate, comprising: gate lines, data lines, and pixel units defined by the gate lines and the data lines crossing with each other, and each pixel unit comprises a first thin film transistor, a gate of which is electrically connected to a gate line of the gate lines, wherein each pixel unit further comprises:
an auxiliary turn-on structure for forming a turn-on voltage at a channel of the first thin film transistor when the first thin film transistor is switched into conduction,
wherein the auxiliary turn-on structure is a second thin film transistor, a gate of the second thin film transistor and the gate of the first thin film transistor are electrically connected with each other, and a drain of the second thin film transistor is used to form the turn-on voltage at the channel of the first thin film transistor;
a common electrode line in the same layer as the gate line, and an insulating spacer layer is provided between a source-drain electrode layer of the second thin film transistor and a source-drain electrode layer of the first thin film transistor; wherein a source of the second thin film transistor is connected to an active layer of the second thin film transistor and the common electrode line; and the drain of the second thin film transistor is connected to the active layer of the second thin film transistor and is located in a region corresponding to the channel of the first thin film transistor.

6. The array substrate according to claim 5, wherein the insulating spacer layer covers the entire array substrate; the source of the second thin film transistor is connected to the active layer through an active region via passing through the insulating spacer layer, and is connected to the common electrode line through a common electrode line via passing through the insulating spacer layer and a gate insulating layer; and the drain of the second thin film transistor is connected to the active layer through a drain via passing through the insulating spacer layer.

7. The array substrate according to claim 5, wherein
the insulating spacer layer covers a region in which the drain of the second thin film transistor overlaps with a source, a drain and the channel of the first thin film transistor, and the source of the second thin film transistor is connected to the common electrode line through a common electrode line via passing through a gate insulating layer.

8. The array substrate according to of claim 1, wherein
the auxiliary turn-on structure is further covered with a passivation layer.

9. A fabrication method of an array substrate, comprising the following steps:
sequentially forming patterns including a gate line and a gate, a gate insulating layer, a first active layer and a second active region on a substrate;
forming a pattern including a data line, a first source and a first drain to form a first TFT;
forming an insulating spacer layer; and
forming a pattern including a second source and a second drain, so as to form a second TFT, so that gate of the second TFT and gate of the first TFT are electrically connected with each other, and the second drain is located above a channel between the first source and the first drain.

10. The fabrication method of an array substrate according to claim 9, wherein
the step of forming the insulating spacer layer specifically comprises: forming the insulating spacer layer covering a region in which the second drain overlaps with the first source, the first drain, and the channel between the first source and the first drain;
after forming the insulating spacer layer and before forming the pattern including the second source and the second drain, the fabrication method further comprises: forming a gate line via in a region in the gate insulating layer and the second active layer corresponding to the second source to expose the gate line.

11. The fabrication method of an array substrate according to claim 9, wherein the step of forming the insulating spacer layer specifically comprises:
forming the insulating spacer layer covering the entire substrate, at the same time forming a gate line via in a region on the insulating spacer layer corresponding to the second source to expose the gate line, and forming a drain via in a region on the insulating spacer layer corresponding to the second drain to expose the second active layer.

12. The fabrication method of an array substrate according to claim 9, wherein a common electrode line is also formed while forming the gate line.

13. The fabrication method of an array substrate according to claim 12, wherein
the step of forming the insulating spacer layer specifically comprises: forming the insulating spacer layer covering a region in which the second drain overlaps the first source, the first drain, and the channel between the first source and the first drain;
after forming the insulating spacer layer and before forming the pattern including the second source and the second drain, the fabrication method further comprises: forming a common electrode line via in a region on the gate insulating layer corresponding to the second source to expose the common electrode line.

14. The fabrication method of an array substrate according to claim 12, wherein the step of forming the insulating spacer layer specifically comprises:
forming the insulating spacer layer covering the entire substrate, at the same time forming a common electrode line via in a region on the insulating spacer layer corresponding to the second source to expose the common electrode line, forming a drain via in a region on the insulating spacer layer corresponding to the second drain to expose the second active layer, and forming an active region via in a region on the insulating spacer layer corresponding to the second source to expose the second active layer.

15. A display device comprising an array substrate, comprising pixel units defined by the gate lines and the data lines crossing with each other, and each pixel unit comprises a first thin film transistor, gate of which is electrically connected to a gate line of the gate lines, wherein each pixel unit further comprises
an auxiliary turn-on structure for forming a turn-on voltage at a channel of the first thin film transistor when the first thin film transistor is switched into conduction,
wherein the auxiliary turn-on structure is a second thin film transistor, a gate of the second thin film transistor and the gate of the first thin film transistor are electrically connected with each other, and a drain of the second thin film transistor is used to form the turn-on voltage at the channel of the first thin film transistor,
wherein an insulating spacer layer is provided between a source-drain electrode layer of the second thin film transistor and a source-drain electrode layer of the first thin film transistor; a source of the second thin film transistor is connected to an active layer of the second thin film transistor and the gate line; and the drain of the second thin film transistor is connected to the active layer of the second film transistor and is at least partially located in a region corresponding to the channel of the first thin film transistor.

* * * * *